United States Patent
Chou et al.

(10) Patent No.: US 10,165,208 B2
(45) Date of Patent: Dec. 25, 2018

(54) METHOD FOR REDUCING BLOOMING IN IMAGE SENSOR DURING IDLE PERIOD

(71) Applicant: Taiwan Semiconductor Manufacturing Company Limited, Hsin-Chu (TW)

(72) Inventors: Kuo-Yu Chou, Hsinchu (TW); Calvin Yi-Ping Chao, Zhubei (TW); Fu-Lung Hsueh, Kaohsiung (TW); Honyih Tu, Hsinchu (TW); Jhy-Jyi Sze, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 341 days.

(21) Appl. No.: 15/011,951

(22) Filed: Feb. 1, 2016

(65) Prior Publication Data

US 2016/0150167 A1 May 26, 2016

Related U.S. Application Data

(62) Division of application No. 13/759,115, filed on Feb. 5, 2013, now Pat. No. 9,270,908.

(51) Int. Cl.
| | |
|---|---|
| *H01L 27/00* | (2006.01) |
| *H04N 5/359* | (2011.01) |
| *H01L 27/146* | (2006.01) |
| *H04N 5/04* | (2006.01) |
| *H04N 5/378* | (2011.01) |

(52) U.S. Cl.
CPC ..... *H04N 5/3591* (2013.01); *H01L 27/14609* (2013.01); *H04N 5/04* (2013.01); *H04N 5/3594* (2013.01); *H04N 5/378* (2013.01)

(58) Field of Classification Search
CPC ............. H01L 27/146; H01L 27/14609; H01L 27/14656
USPC ....... 250/208.1, 214.1, 214 R; 348/297, 299, 348/304, 308
See application file for complete search history.

(56) References Cited

U.S. PATENT DOCUMENTS

| | | | |
|---|---|---|---|
| 9,270,908 B2 * | 2/2016 | Chou | ................ H01L 27/14609 |
| 2006/0092300 A1 | 5/2006 | Tan et al. | |
| 2009/0273696 A1 | 11/2009 | Krymski | |

(Continued)

FOREIGN PATENT DOCUMENTS

EP 2279614 B1 2/2011

*Primary Examiner* — Kevin Pyo
(74) *Attorney, Agent, or Firm* — Cooper Legal Group, LLC

(57) ABSTRACT

Among other things, techniques and systems are provided for identifying when a pixel of an image sensor is in an idle period. A flag is utilized to differentiate when the pixel is in an idle period and when the pixel is in an integration period. When the flag indicates that the pixel is in an idle period, a blooming operation is performed on the pixel to reduce an amount of electrical charge that has accumulated at the pixel or to mitigate electrical charge from accumulating at the pixel. In this way, the blooming operation reduces a probability that the photosensitive sensor becomes saturated during an idle period of the pixel, and thus reduces the likelihood of electrical charge from a pixel that is not intended contribute to an image from spilling over and potentially contaminating a pixel that is intended to contribute to the image.

14 Claims, 5 Drawing Sheets

(56) References Cited

U.S. PATENT DOCUMENTS

2011/0169989 A1 7/2011 Kono et al.
2012/0175498 A1 7/2012 Krymski

* cited by examiner

METHOD FOR REDUCING BLOOMING IN IMAGE SENSOR DURING IDLE PERIOD

RELATED APPLICATION

This application is a divisional of and claims priority to U.S. patent application Ser. No. 13/759,115, titled "IMAGE SENSOR CONFIGURED TO REDUCE BLOOMING DURING IDLE PERIOD" and filed on Feb. 5, 2013, which is incorporated herein by reference.

BACKGROUND

Image sensors are found in a variety of consumer electronics and industrial electronics. For example, digital cameras, digital video systems, and other image capture devices, such as copiers, use image sensors to capture a scene and convert the scene into an image. One type of image sensor that is commonly used in image capture devices is a solid-state image sensor, such as a complementary metal-oxide semiconductor (CMOS) image sensor. When a pixel array of the solid-state image sensor is exposed to light, photosensitive sensors of the pixel array convert the light into voltage. The voltage generated by respective photosensitive sensors is subsequently measured and used to generate or reconstruct an image.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

According to some embodiments, systems and techniques for identifying whether a pixel is in an idle period or an integration period and performing a blooming operation on the pixel when the pixel is identified as being in an idle period are provided. For example, in some embodiments, a control circuit of an image sensor comprises a flagging component configured to set a flag when the pixel is in an idle period and to clear the flag when the pixel is in an integration period. When the flagging component identifies that a pixel is in an idle period, a blooming operation is permitted to be performed. The blooming operation is configured to reduce an amount of electrical charge that has accumulated at a photosensitive sensor of the pixel during the idle period or to mitigate electrical charge from accumulating at the photosensitive sensor during at least a portion of the idle period, thus reducing a probability that the photosensitive sensor will become saturated and bloom.

In some embodiments, the blooming operation comprises applying an idle reset to the pixel to dissipate electrical charge that as accumulated at the photosensitive sensor and to reset a floating diffusion node of the pixel. In other embodiments, the blooming operation comprises maintaining the pixel in a reset set or a prolonged idle reset, for at least a portion of the idle period to dissipate electrical charge that has accumulated at the photosensitive sensor and to mitigate additional electrical charge from accumulating at the photosensitive sensor. In still other embodiments, the blooming operation comprises transferring, during the idle period, at least a portion of the accumulated electrical charge from the photosensitive sensor to another portion of the pixel, such as the floating diffusion node.

The following description and annexed drawings set forth certain illustrative aspects and implementations. These are indicative of but a few of the various ways in which one or more aspects are employed. Other aspects, advantages, and novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and structures of the drawings are not necessarily be drawn to scale. Accordingly, the dimensions of the various features is arbitrarily increased or reduced for clarity of discussion.

DETAILED DESCRIPTION

Figure 1:
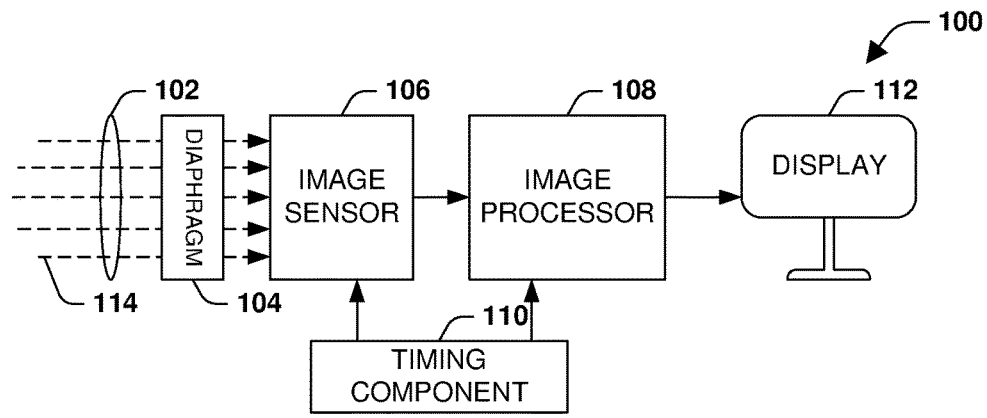
FIG. 1 is a component block diagram illustrating an example light-capturing device according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

A solid-state image sensor, such as a CMOS image sensor, typically comprises a plurality of pixels arranged to form a pixel array. Respective pixels comprise a photosensitive sensor, such as a phototransistor, a photodiode, or the like. Under normal operation, respective pixels switch between an integration period and an idle period. While a pixel is in an integration period, a series of processes are performed on the pixel to measure the electrical charge that accumulates during the integration period. After the pixel has performed the series of processes and the accumulated electrical charge is measured, the pixel enters an idle period. While light is detected and converted to electrical charge during the idle period, electrical charge generated while the pixel is in the idle period is not measured or used to generate an image.

Where a photosensitive sensor of a pixel accumulates electrical charge while the pixel is in an idle period, a phenomenon known as blooming occurs in some instances. Blooming occurs when a photosensitive sensor of a pixel accumulates too much electrical charge and becomes saturated, causing excess charge from the pixel to spill over into a neighboring pixel, which is in an integration period in some instances. The longer the pixel remains in an idle period, the more likely it is that spillover will occur. Such spillover contributes to, among other things, blurring or other image artifacts in an image produced from measurements yielded by the pixel array.

Accordingly, as provided for herein, systems and techniques are described to identify when a pixel is in an idle period and when to perform a blooming operation on the pixel while idled. For example, in some embodiments, an idle reset is intermittently or periodically performed, while the pixel is in an idle period, to reduce an amount of electrical charge that has accumulated during an earlier portion of the idle period. Such an idle reset is not intended to trigger the pixel to enter an integration period. Rather, the idle reset is performed merely to discharge at least some electrical charge that has accumulated at the photosensitive sensor during the idle period to reduce the possibility of the photosensitive sensor becoming saturated, and thus reducing the possibility of blooming. Other examples of a blooming operation that are performed while the pixel is in an idle period include, among other things, placing the pixel in a reset state for a duration of a portion of the idle period, to mitigate electrical charge accumulation during the portion of the idle period, for example, or applying a voltage to one or more transistors of the pixel to facilitate movement of the electrical charge from the photosensitive sensor to another portion of the pixel where blooming is less likely to occur, such as a floating diffusion node, for example. It will be appreciated that in some embodiments, one or more of transistors respectively function or operate as a switch. Accordingly, in some embodiments, it is possible to substitute a different type of electrical switch for a transistor, for example. It will be appreciated that, in some embodiments, when a transistor is turned on, the transistor operates as a closed switch, such as to conduct current, for example. It will be appreciated that, in some embodiments, when a transistor is turned off, the transistor operates as an open switch, such as to not conduct current, for example.

FIG. 1 is a component block diagram illustrating an example light-capturing device 100 configured to convert light 114 that impinges the light-capturing device 100 into electrical signals that are representative of the light 114. For example, in some embodiments, the voltage of an electrical signal generated by an image sensor 106 of the light-capturing device is proportional to an amount of light 114 that is detected by the light image sensor 106. Example light-capturing devices 100 include, among other things, digital cameras, digital video systems, scanners, copiers, and other devices that digitally generate an image of a scene. In still other embodiments, the light-capturing device 100 includes devices that are configured to measure an amount of light over a specified exposure time, but not necessarily configured to generate an image based upon the measured amount of light.

The example light-capturing device 100 comprises a lens 102, diaphragm 104, image sensor 106, image processor 108, timing component 110, and display 112. The lens 102 is typically substantially transparent to light 114 and is configured to protect the image sensor 106 or other sensitive electronics of the light-capturing device 100, such as from dust, debris, fingerprints, etc., for example. In some embodiments, the lens 102 is further shaped to refract light 114, causing the light 114 to converge or to diverge, for example.

The diaphragm 104 is configured to control exposure of the image sensor 106 to light 114. That is, the diaphragm 104 regulates the amount of light 114 that passes from the lens 102 to the image sensor 106. As an example, the diaphragm 104 is constructed of a plurality of adjustable fins shaped to form an aperture at approximately a center of the diaphragm 104. Based upon a desired exposure, one or more of the fins are adjusted to increase the aperture, allowing more light 114 to impinge the image sensor 106, for example, or to decrease the aperture, allowing less light 114 to impinge the image sensor 106, for example. In some embodiments, the diaphragm 104 is configured to adjust one or more fins such that the aperture is removed or fully closed when it is desirable to shield the image sensor 106 from light 114.

The image sensor 106 is configured to detect light 114 impinging upon a detection surface of the image sensor 106 and to convert the light 114 into electrical signals. For example, as further described with respect to FIG. 2, the image sensor 106 comprises a pixel array. Respective pixels of the pixel array comprise, among other things, a photosensitive sensor, such as a photodiode or a phototransistor, configured to convert the light 114 into electrical charge. The electrical charge generated during an integration period is read out of the pixel and measured to determine an amount of light that impinged the photosensitive sensor during the integration period. In some embodiments, the pixel array of the image sensor 106 is a solid-state pixel array. In other embodiments, the pixel array of the image sensor 106 is a complementary metal-oxide semiconductor array (CMOS array).

The image processor 108 is configured to collect measurements yielded from respective pixels of the pixel array and to generate or reconstruct an image based upon the measurements. In some embodiments, the image processor 108 is further configured to convert analog signals output by the image sensor 106 into digital signals, which are accumulated and stored in memory.

A timing component 110 of the example light-capturing device 100 is configured to provide timing signals to the image sensor 106 and the image processor 108 for controlling the image sensor 106 and the image processor 108. In some embodiments, the timing signals are further configured to synchronize operations of the image sensor 106 with operations of the image processor 108.

The display 112 is configured to display an image generated or reconstructed by the image processor 108 from the detected light 114. Accordingly, the display 112 presents, such as to a user, a rendering of a scene that the light-capturing device 100 is focused upon.

Figure 2:
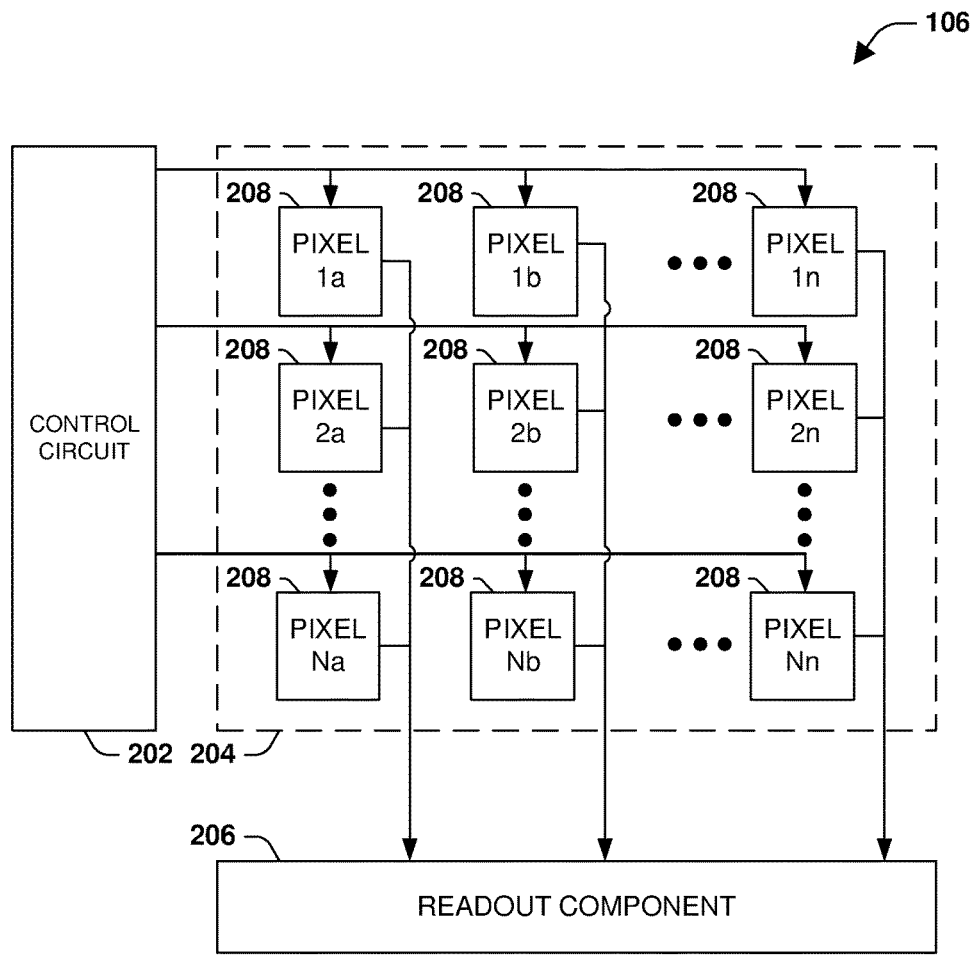
FIG. 2 is a component block diagram illustrating an example image sensor according to some embodiments.

FIG. 2 is a component block diagram illustrating an example image sensor 106 configured to detect light and to convert the light to electrical charge.

The example image sensor 106 comprises a control circuit 202, a pixel array 204, and a readout component 206. In the illustrated embodiment, pixels 208 of the pixel array 204 are arranged in rows, extending horizontally on the page, and columns, extending vertically one the page. A row of pixels 208 is identified by a like number. For example, pixels 208 of a first row are labeled with the number "1," pixels 208 of a second row are labeled with the number "2," etc. The number of rows is equal to "N," where "N" is a positive integer greater than or equal to one. A column of pixels 208 is identified by a like alphabetical letter. For example, pixels 208 of a first column are labeled with the letter "a," pixels 208 of a second column are labeled with the letter "b," etc. The number of columns is equal to "n," where "n" is a positive integer greater than or equal to one.

The control circuit 202 is configured to drive one or more pixels 208 of the pixel array 204 of the image sensor 106 via control signals that are transmitted to the one or more pixels 208. In the illustrated embodiment, the control circuit 202 is configured for row-by-row control. That is, control signals transmitted via a first control channel are configured to drive pixels 208 of the first row, control signals transmitted via a second control channel are configured to drive pixels 208 of the second row, etc. Thus, pixels 208 of the first row share common control signals and pixels 208 of the second row share common control signals. In other embodiments, the control circuit 202 is configured for pixel-by-pixel control, such that the control circuit 202 is configured to control a first pixel of a first row separately from a second pixel of the first row. In still other embodiments, the control circuit 202 is configured to control a first portion of a row separately from a second portion of the row. In yet other embodiments, the control circuit 202 is configured to control multiple rows or portions of multiple rows via common control signals. Accordingly, a level of control granularity differs by application, for example.

The pixel array 204 is configured to detect light impinging a detection surface of the pixel array 204 and to convert the light into electrical charge. For example, as further described with respect to FIG. 3, in some embodiments, respective pixels 208 of the pixel array 204 comprise a photosensitive sensor configured to convert light into electrical charge. Charge that accumulates at the photosensitive sensor while the pixel 208 is in an integration period, defined based upon a desired exposure time, for example, is utilized to generate a readout signal that is transmitted over a readout channel. In some embodiments, the pixel array 204 is a solid-state pixel array. In other embodiments, the pixel array 204 is a CMOS array.

In the illustrated embodiment, the pixels 208 are read out column-by-column. That is, readout signals generated by pixels 208 of a first column are transmitted over a first readout channel, readout signals generated by pixels 208 of a second column are transmitted over a second readout channel, etc. In other embodiments, the pixels 208 are read out pixel-by-pixel, where no two pixels share a readout channel, for example. In still other embodiments, readout signals generated by pixels 208 of a first portion of a column are transmitted via a different readout channel than readout signals generated by pixels of a second portion of the column. In still other embodiments, readout signals generated by pixels 208 of multiple columns are transmitted via a readout channel.

In the illustrated embodiment, the readout signals are transmitted to a readout component 206 of the image sensor 106 configured to read out respective pixels 208, to determine an amount of charge measured by respective pixels 208, for example. In some embodiments, the readout component 206 is configured to perform a correlated double sampling (CDS) process, using the readout signals from respective pixels 208, to determine an amount of charge measured by respective pixels 208. In other embodiments, the readout component 206 is configured to use other readout processes in addition to a CDS process or as substitution for a CDS process to determine an amount of charge measured by respective pixels 208.

Figure 3:
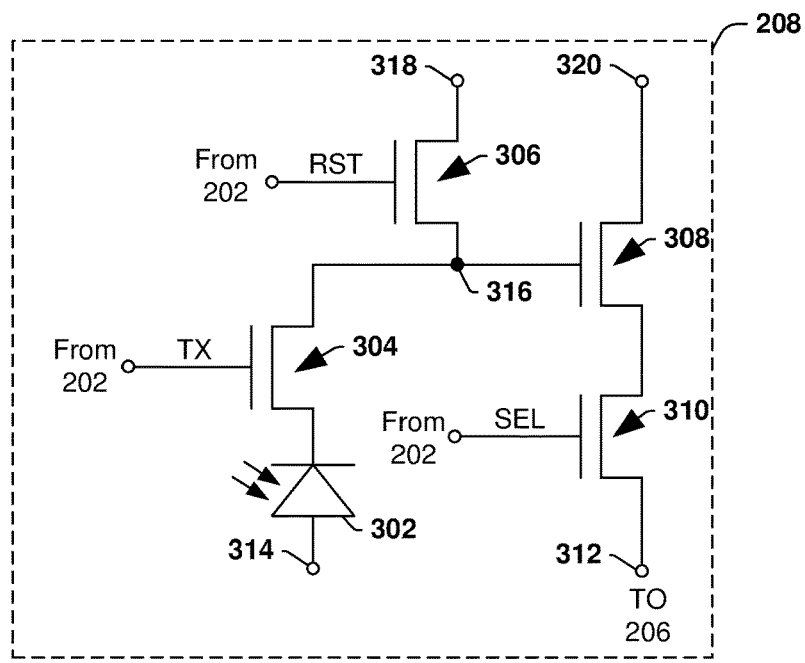
FIG. 3 is a schematic illustrating an example pixel of a pixel array of an image sensor according to some embodiments.

FIG. 3 illustrates a schematic diagram of an example pixel 208 of a pixel array 204 of an image sensor 106. The pixel 208 is configured to measure or sample light to which the image sensor 106 is exposed. More particularly, the pixel 208 is configured to convert light impinging the pixel 208 into electrical charge that is measured to approximate an amount of light that impinged the pixel during an integration period, or a sampling period, for example.

The pixel 208 comprises a photosensitive sensor 302, a transfer transistor 304, a reset transistor 306, a source follower transistor 308, and a selection transistor 310. In some embodiments, one or more of at least one of the transfer transistor 304, the reset transistor 306, the source follower transistor 308, or the selection transistor 310 are n-type transistors, such as n-channel metal-oxide semiconductor field effect (NMOS) transistors. In still other embodiments, one or more of at least one of the transfer transistor 304, the reset transistor 306, the source follower transistor 308, or the selection transistor 310 are p-type transistors, such as p-channel metal-oxide semiconductor field effect (PMOS) transistors. Examples of the photosensitive sensor 302 include, among other things, a photodiode and phototransistor.

In the illustrated embodiment, a first aspect of the transfer transistor 304, a first aspect of the reset transistor 306, and a first aspect of the selection transistor 310 are respectively coupled to the control circuit 202 and are configured to receive control signals. By way of example, the first aspect of the transfer transistor 304 is configured to receive a transfer aspect (TX) of the control signals, a first aspect of the reset transistor 306 is configured to receive a reset aspect (RST) of the control signals, and a first aspect of the selection transistor 310 is configured to receive a selection aspect (SEL) of the control signals. In some embodiments, the first aspect of the transfer transistor 304, the first aspect of the reset transistor 306, and the first aspect of the selection transistor 310 is a gate of respective transistors 304, 306, and 310.

An output of the pixel 208, such as a readout signal indicative of an amount of electrical charge measured during an integration period, for example, is output at an output terminal 312 to the readout component 206.

A first portion of the photosensitive sensor 302, such as an anode of a photodiode, is coupled to a grounding wire via a grounding terminal 314. A second portion of the photosensitive sensor 302, such as a cathode of the photodiode, is coupled to a second aspect of the transfer transistor 304, such as a source of the transfer transistor 304. A third aspect of the transfer transistor 304, such as a drain of the transfer transistor 304, is coupled to a floating diffusion node 316, at times referred to as "FD". The floating diffusion node 316 is further coupled to a second aspect of the reset transistor 306, such as a source of the reset transistor 306, and to a first aspect of the source follower transistor 308, such as a gate of the source follower transistor 308.

A third aspect of the reset transistor 306, such as a drain of the reset transistor 306, is coupled to a first voltage source (not shown) via a first source terminal 318. A third aspect of the source follower transistor 308, such as a drain of the source follow transistor 308, is coupled to a second voltage source (not shown) via a second source terminal 320. In some embodiments, the first voltage source and the second voltage source are a same voltage source. In other embodiments, the first voltage source is a different voltage source than the second voltage source.

A second aspect of the source follower transistor 308, such as a source of the source follower transistor 308, is coupled to a third aspect of the selection transistor 310, such as a drain of the selection transistor 310. A second aspect of the selection transistor 310, such as a source of the selection transistor 310, is coupled to the output terminal 312.

Figure 4:
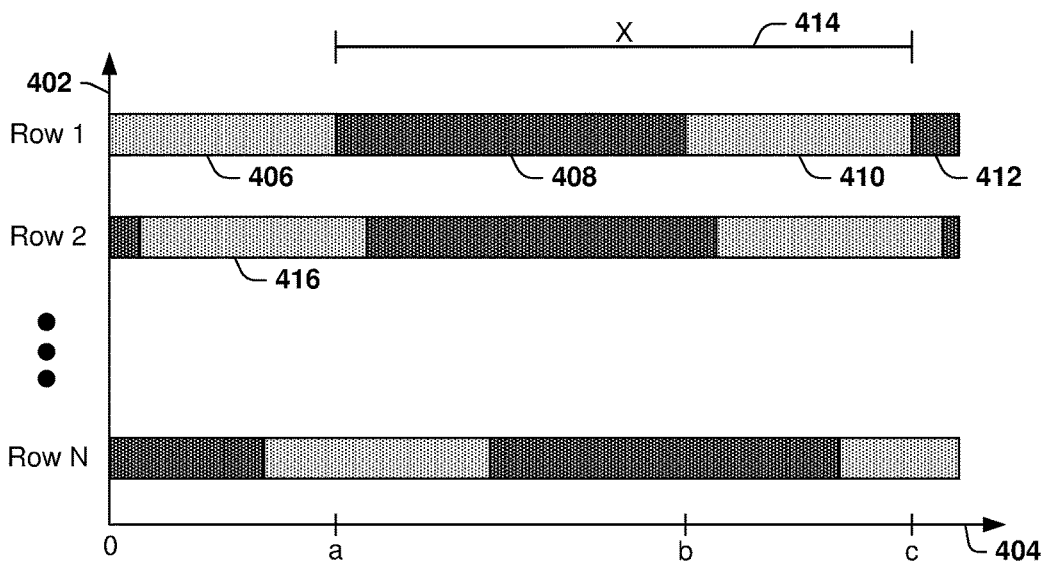
FIG. 4 is a diagram illustrating an example switching schematic for a control circuit of an image sensor according to some embodiments.

The pixel 208 is associated with, or switches between, an integration period and an idle period. By way of example, FIG. 4 is a diagram illustrating an example switching schematic 400, or timing schematic, for the control circuit 202, where the control circuit 202 is configured for row-by-row control of pixels 208 of a pixel array 204. The y-axis 402 represents detector row and the x-axis 404 represents time. Pixels 208 of respective rows switch between an integration period, represented by the lightly-shaded areas, and an idle period, represented by the darker-shaped areas. For example, a first integration period 406 for pixels 208 of row 1 begins at time 0 and ends at time "a," when the pixels 208 of row 1 enter a first idle period 408. The first idle period 408 ends at time "b," when a second integration period 410 begins. The second integration period 410 ends at time "c," when a second idle period 412 begins. In embodiments where the control circuit 202 is configured for row-by-row control, a cycle time is defined as an amount of time that lapses between when a row of pixels 208 enters a first idle period and when the row of pixels 208 enters a second idle period. For example, in the illustrated embodiment, a cycle for row 1 is defined as "X" 414. In some embodiments, respective rows of the pixel array 204 have a same cycle time. In other embodiments, a first set of one or more rows have a different cycle time than a second set of one or more rows.

In the illustrated embodiment, respective rows of the pixel array 204 have a same cycle time, such that the amount of time spent in each cycle is the same, for example, but a cycle of the second row is phase shifted relative to a cycle of the first row. Accordingly, a first integration period 406 of the first row begins before a first integration period 416 of a second row, for example. In some embodiments, two or more rows of the pixel array 204 are in phase with one another. In other embodiments, no two rows of the pixel array 204 are in phrase with one another.

Figure 5:
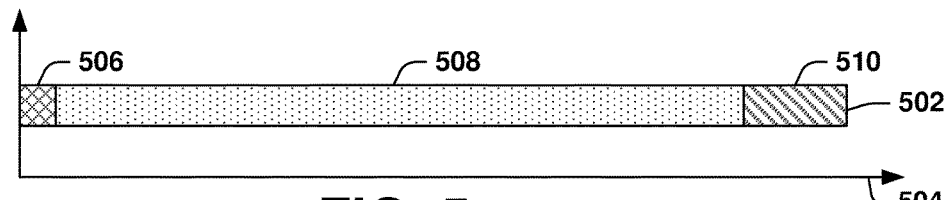
FIG. 5 is a diagram illustrating an example timing schematic describing an example series of process that occur during an integration period of a pixel according to some embodiments.

While a pixel 208 is in an integration period, a series of processes are performed on the pixel 208 to measure the electrical charge that accumulates during the integration period. FIG. 5 is a diagram illustrating an example timing schematic 500 describing an example series of process that occurs during an integration period 502, such as during the first integration period 406 of the first row. The x-axis 504 represents time.

The integration period 502 is defined by a reset period 506, an exposure period 508, and a readout period 510. During the reset period 506, the pixel 208 is reset by applying a reset voltage to the pixel 208. In some embodiments, the reset voltage facilitates discharging electrical charge from a photosensitive sensor 302 of the pixel 208. It other embodiments, the reset voltage facilitates resetting a floating diffusion node 316 of the pixel 208. In still other embodiments, the reset voltage facilitates discharging electrical charge from the photosensitive sensor 302 and resetting the floating diffusion node 316. The reset period 506 ends and the exposure period 508 begins when the reset voltage is removed.

During the exposure period 508, the photosensitive sensor 302 is exposed to light. The detected light creates free electrons in, or at, the photosensitive sensor 302, causing the light to be converted into electrical charge. After a desired amount of time has lapsed, defined by a desired exposure of the light-capturing device 100, for example, the exposure period 508 ends and the pixel transitions to a readout period 510, during which time the electrical charge that has accumulated in or at the photosensitive sensor 302 is transferred to the floating diffusion node 316, where the charge remains until the pixel 208 is read out, such as by the readout component 206. The readout period 510, and the integration period 502, ends when the charge is read out of the pixel 208. The pixel 208 then enters an idle period until another sample is desired.

As previously described, the photosensitive sensor 302 continues to convert light into electrical charge during the idle period, which leads to saturation of the photosensitive sensor 302 and blooming in some instances. Accordingly, the control circuit 202 is configured to track whether a pixel 208 is in an integration period or an idle period. That is, stated differently, the control circuit 202 is configured to identify when the pixel 208 is in an integration period and when the pixel 208 is in an idle period. The control circuit 202 is further configured to perform a blooming operation on the pixel 208 during an identified idle period to reduce a probability of electrical charge spilling over into a neighboring pixel.

Figure 6:
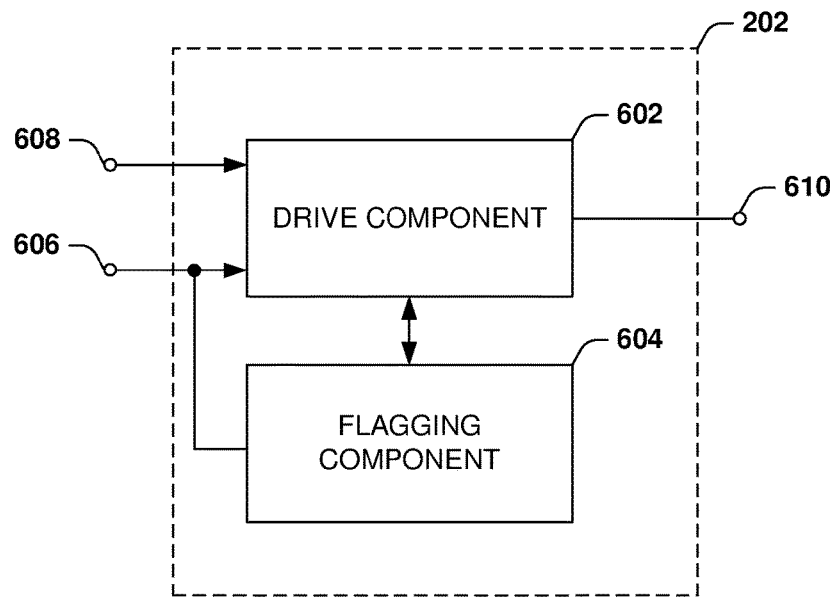
FIG. 6 is a component block diagram illustrating an example control circuit of an image sensor according to some embodiments.

FIG. 6 illustrates an example control circuit 202 of the image sensor 106. The control circuit 202 comprises a drive component 602 and a flagging component 604. The drive component 602 is configured to drive one or more pixels 208 via a control signal that is output to the pixel array 204 via an output terminal 610. For example, with reference to FIG. 2, the drive component 602 is operably coupled to a plurality of control channels through which control signals are transmitted, where a first control channel is configured to supply control signals to a first row of pixels 208, a second control channel is configured to supply control signals to a second row of pixels 208, etc. As previously described, in some embodiments, the control signals output by the drive component 602 comprise a transfer aspect, configured to control the transfer transistor 304, for example, a reset aspect, configured to control the reset transistor 306, for example, and a selection aspect, configured to control the selection transistor 310, for example.

In some embodiments, the drive component 602 is configured to receive one or more timing signals via a first input terminal 606 from a timing component 110 to provide timing information to the drive component 602, such as, among other things, a cycle time for respective rows, a switching frequency for respective rows, etc. In the illustrated embodiment, the drive component 602 is further configured to receive one or more signals via an input terminal 608. By way of example, in some embodiments, the drive component 602 is configured to receive a transfer signal associated with a transfer transistor 304 and configured to facilitate controlling the transfer transistor 304, a reset signal associated with the reset transistor 306 and configured to facilitate controlling the reset transistor 306, and a selection signal associated with the selection transistor 310 and configured to facilitate controlling the selection transistor 310.

The flagging component 604 is in operable communication with the drive component 602 and is configured to identify when a pixel is in an integration period and when the pixel is in an idle period. By way of example, in the illustrated embodiment, the flagging component 604 is configured to receive timing signals associated with one or more pixels 208 from the timing component 110 via the input terminal 606 to monitor when a pixel 208 enters an integration period and when the pixel 208 enters an idle period. In some embodiments, the flagging component 604 is configured to set a flag when a pixel 208 enters an idle period and to clear the flag when the pixel 208 exits the idle period, and enters an integration period. In other embodiments, the flagging component 604 is configured to set a flag when the pixel 208 enters an integration period and to clear the flag when the pixel 208 exits the integration period, and enters an idle period. In this way, the flagging component 604 tracks whether one or more pixels 208 are respectively in an integration period or are respectively in an idle period. In some embodiments, the flagging component 604 provides such information to the drive component 602 to facilitate a determination by the drive component 602 whether a particular pixel 208 is in an idle period and to facilitate a determination by the drive component 602 whether a blooming operation is permitted be performed on the particular pixel 208, because the particular pixel 208 in an idle period.

The drive component 602 is further configured to perform a blooming operation on a pixel 208, or a row of pixels where the control circuit 202 is configured for row-by-row control, for example, when the pixel 208 is identified by the flagging component 604 as being in an idle period. In some embodiments, such a blooming operation is configured to reduce the amount of charge that has accumulated at the photosensitive sensor 302 of a pixel 208 during the idle period to reduce the possibility of the pixel 208 becoming saturated. By way of example, in some embodiments, the drive component 602 is configured to perform an idle reset on the pixel 208 at least once during an idle period to discharge at least some of the electrical charge that has accumulated at the photosensitive sensor 302 during the idle period.

An example idle reset operation for a pixel 208 is as follows. During a first portion of the idle period, prior to the idle reset being performed, the drive component 602 applies first voltage, such as a low voltage, for example, to the reset transistor 306 and applies a second voltage, such as a low voltage, for example, to the transfer transistor 304, such that the reset transistor 306 and the transfer transistor 304 are turned off. While the reset transistor 306 and the transfer transistor 304 are turned off, electrical charge accumulates at the photosensitive sensor 302. Upon receipt of an indication of a desire to perform an idle reset, and while still in the idle period, the drive component 602 applies a third voltage, such as a higher voltage, for example, to the reset transistor 306, causing a higher voltage to be applied to the reset transistor 306, and applies a fourth voltage, such as a higher voltage, for example, to the transfer transistor 304, respectively causing the reset transistor 306 and the transfer transistor 304 to turn on. In some embodiments, the activation of the reset transistor 306 and the transfer transistor 304 facilitate a discharge of electrical charge that has accumulated at the photosensitive sensor 302 during the first portion of the idle period, and a reset of the floating diffusion node, for example. The drive component 602 applies the third voltage to the reset transistor 306 and applies the fourth voltage to the transfer transistor 304 for a short time, such as long enough for the electrical charge to dissipate, for example. After at least a portion of the electrical charge has dissipated from the photosensitive sensor 302, the drive component reapplies the first voltage to the reset transistor 306 and reapplies the second voltage to the transfer transistor 304, causing the reset transistor 306 and the transfer transistor 304 to turn off. It is to be appreciated that the idle reset does not trigger the pixel 208 to enter into an integration period, such that the pixel 208 remains in the idle period after the idle reset. Although, in some embodiments, an operation performed by the drive component 602 during the idle reset is similar to an operation performed during the reset period 506 of an integration period 502.

In other embodiments, the drive component 602 is configured to perform a blooming operation that mitigates the possibility of electrical charge accumulating at the photosensitive sensor 302 during at least a portion of the idle period. For example, the drive component 602 is configured to maintain the pixel 208 in a reset state, such as a prolonged idle reset where the transfer transistor 304 and the reset transistor 306 are turned on, for example, during at least a portion of the idle period to mitigate a buildup of electrical charge at the photosensitive sensor 302 of the pixel 208 during the at least a portion of the idle period. In some embodiments, the activation of the transfer transistor 304 and the reset transistor 306 during at least a portion of the idle period allows electrical charge generated at the photosensitive sensor 302 to flow through the pixel 208 and exit the pixel 208 without accumulating. In some embodiments the reset state is maintained for a full duration of an idle period. In other embodiments, the reset state is maintained for merely a portion of the idle period.

In still other embodiments, the drive component 602 is configured to perform a blooming operation that facilitates the transfer of electrical charge from the photosensitive sensor 302 to a voltage source, such as coupled to the first source terminal 318, As an example, the drive component 602 is configured to apply, during the idle period, a voltage to the transfer transistor 304 that turns on the transfer transistor 304 and to apply a voltage to the reset transistor 306 that turns on the reset transistor 306. In this way, the electrical charge is transferred from the photosensitive sensor to a voltage source via the first source terminal 318, for example, to mitigate a possibility of the electrical charge spilling over into a neighboring pixel 208, for example.

Figure 7:
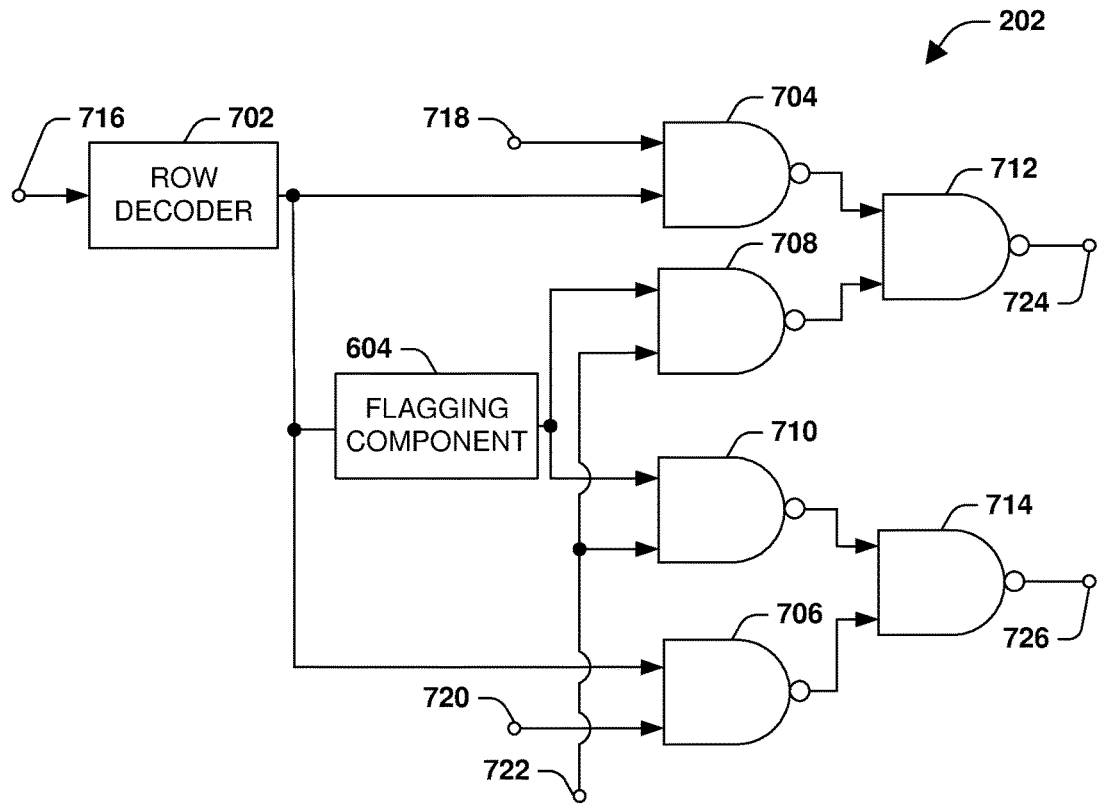
FIG. 7 is a schematic diagram illustrating an example control circuit of an image sensor according to some embodiments.

FIG. 7 is a schematic diagram illustrating another example embodiment of a control circuit 202 configured to perform a blooming operation on a pixel 208, or row of pixels 208, when it is identified, by a flagging component 604, that the pixel 208, or row of pixels 208, is in an idle period. In some embodiments where a control circuit 202 is configured to control a plurality of rows independently, or a plurality of pixels 208 independently, an arrangement similar to the example arrangement is substantially duplicated for respective independent rows or for respective independent pixels 208, for example. In some embodiments, the embodiment illustrated in FIG. 7 is utilized when it is desirable for the control circuit 202 to reduce the buildup of electrical charge at a photosensitive sensor 302 by performing an idle reset or by maintaining the pixel 208 in a reset state.

The example control circuit 202 comprises a row decoder 702 configured to receive timing signals via a first input node 716, such as from a timing component 110. The row decoder 702 is further configured to decode a received timing signal to determine whether the timing signal is associated with or pertains to a pixel 208 being controlled by the control circuit 202. Where the timing signal is associated with a pixel 208 being controlled by the control circuit 202, the row decoder 702 is configured to transmit the timing signal to a first logic gate 704, to a flagging component 604, and to a second logic gate 706. Where the timing signal is not associated with a pixel 208 being controlled by the control circuit 202, the row decoder 702 inhibits the timing signal from interacting with other components of the control circuit 202, for example.

The first logic gate 704, which in some embodiments is a not-and (NAND) logic gate, is configured to compare the timing signal to a first signal, such as a transfer signal provided to the control circuit 202 via a second input node 718, to generate a first output. By way of example, where the timing signal is indicative of a desire for the transfer transistor 304 of the pixel 208 to be turned off, the first output comprises a first set of properties, such as a first voltage, for example. Where the timing signal is indicative of a desire for the transfer transistor 304 to be turned on, the first output comprises a second set of properties, such as a second voltage, for example.

The second logic gate 706, which in some embodiments is a not-and (NAND) logic gate, is configured to compare the timing signal to a second signal, such as a reset signal provided to the control signal via a third input node 720, to generate a second output. By way of example, where the timing signal is indicative of a desire for a reset transistor 306 to be turned off, the second output comprises a first set of properties, such as a first voltage, for example. Where the timing signal is indicative of a desire for the reset transistor 306 to be turned on, the second output comprises a second set of properties, such as a second voltage, for example.

Although changes in one or more properties of the timing signal indicate whether pixel 208 is in an idle period or a reset period, it is typically not possible to determine from a snapshot of the timing signal whether the pixel 208 is in an integration period or an idle period. That is, the timing signal appears similar during some portions of the idle period and some portions of the integration period, such as during an exposure period of the integration period, for example. Accordingly, the flagging component 604 is configured to monitor the timing signal to identify, from changes in the timing signal, when the pixel 208 enters an idle period and to set or clear a flag associated with the pixel 208 as a function of the timing signal.

In some embodiments, the flagging component 604 is configured to set a flag, such as some type of indicator, when the timing signal is indicative of a start of an idle period and to clear the flag when the timing signal is indicative of a start of an integration period. In other embodiments, the flagging component 604 is configured to set a flag when the timing signal is indicative of a start of an integration period and to clear the flag when the timing signal is indicative of a start of an idle period. In this way, the presence or absence of the flag indicates whether the pixel 208 is in an integration period or an idle period.

The flagging component 604 is also configured to generate an output indicative of whether the flag is set or not set. For example, an output signal having a first set of properties, such as a first voltage, for example, is output from the flagging component 604 when the flag is set and an output signal having a second set of properties, such as a second voltage, for example, is output from the flagging component 604 when the flag is not set.

The output of the flagging component is transmitted to a third logic gate 708 and a fourth logic gate 710, which in some embodiments are a not-and (NAND) logic gate. The third logic gate 708 and the fourth logic gate 710 are further configured to receive a blooming signal, such as from a timing component 110 or other controller, for example, via a fourth input terminal 722. The third logic gate 708 and the fourth logic gate 710 are respectively configured to compare the blooming signal to the output of the flagging component 604. When the blooming signal indicates a desire to perform an idle reset, or a desire for the pixel 208 to enter a reset state, for example, and the output of the flagging component 604 indicates that the pixel 208 is in an idle period, the third logic gate 708 and the fourth logic gate 710 are respectively configured to output a signal have a first set of properties, such as a first voltage, for example, indicating that it is acceptable to perform a blooming operation on the pixel 208. When the blooming signal indicates a desire not to perform an idle reset, or a desire for the pixel 208 to not enter a reset state, for example, or the output of the flagging component 604 indicates that the pixel 208 is in an integration period, the third logic gate 708 and the fourth logic gate are respectively configured to output a signal having a second set of properties, such as a second voltage, for example, indicating that it is not acceptable to perform a reset operation.

The outputs of the first logic gate 704 and the third logic gate 708 are output to a fifth logic gate 712, which in some embodiments is a not-and (NAND) logic gate, configured to determine one or more properties of a transfer aspect of a control signal. That is, the fifth logic gate 712 determines whether to output a signal at a first output node 724 that causes the transfer transistor 304 to be turned on or turned off. For example, when the output of the third logic gate 708 indicates a desire to perform an idle reset during the idle period or when the output of the first logic gate 704 indicates a desire to turn on the transfer transistor 304 during an integration period, the fifth logic gate 712 outputs a signal that causes the transfer transistor 304 to turn on. When the output of the third logic gate 708 indicates a desire not to perform an idle reset during the idle period or the output of the first logic gate 704 indicates a desire to turn off the transfer transistor 304 during an integration period, the fifth logic gate 712 outputs a signal that causes the transfer transistor 304 to turn off, for example.

The outputs of the second logic gate 706 and the fourth logic gate 710 are output to a sixth logic gate 714, which in some embodiments is a not-and (NAND) logic gate, configured to determine one or more properties of a reset aspect of a control signal. That is, the sixth logic gate 714 determines whether to output a signal at a second output node 726 that causes the reset transistor 306 to turn on or turn off. For example, when the output of the fourth logic gate 710 indicates a desire to perform an idle reset during the idle period or when the output of the second logic gate 706 indicates a desire to turn on the reset transistor 306 during an integration period, the sixth logic gate 714 outputs a signal that causes the reset transistor 306 to turn on. When the output of the fourth logic gate 710 indicates a desire not to perform an idle reset during the idle period or the output of the first logic gate 704 indicates a desire to turn off the reset transistor 306 during an integration period, the sixth logic gate 714 outputs a signal that causes the reset transistor 306 to be turn off, for example.

It is to be appreciated that while the example control circuit 202 illustrated in FIG. 7 describes the logic gates 704, 706, 708, 710, 712, and 714 as NAND gates, in some embodiments, one or more of the foregoing logic gates are other types of logic gates or electrical components configured to generate an output as a function of two or more inputs.

Figure 8:
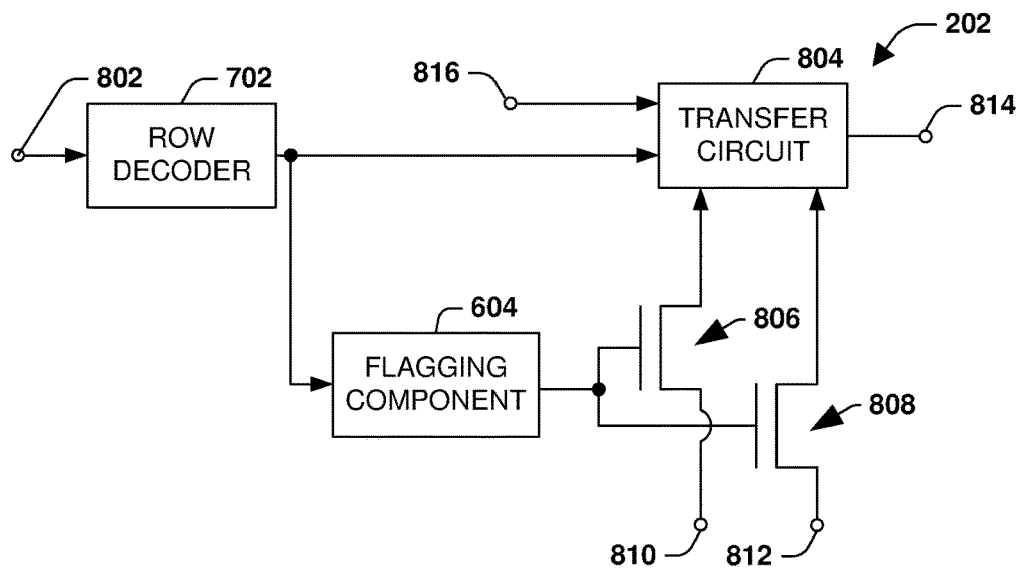
FIG. 8 is a schematic diagram illustrating an example control circuit of an image sensor according to some embodiments.

FIG. 8 is a schematic diagram illustrating another example embodiment of a control circuit 202 configured to perform a blooming operation on a pixel 208, or row of pixels 208, when it is identified, by a flagging component 604, that the pixel 208, or row of pixels 208, is in an idle period. In some embodiments, where a control circuit 202 is configured to control a plurality of rows independently, or a plurality of pixels 208 independently, an arrangement similar to the example arrangement is substantially duplicated for respective independent rows or for respective independent pixels 208, for example. In some embodiments, the example configuration is utilized when is desirable for the control circuit 202 to reduce the buildup of electrical charge at a photosensitive sensor 302 by transferring the electrical charge to another portion of the pixel 208, such as a floating diffusion node 316, to a voltage source coupled to the pixel 208 or to ground.

The example control circuit 202 comprises a row decoder 702 configured to receive timing signals via a first input node 802, such as from a timing component 110. The row decoder 702 is further configured to decode the received timing signals to determine whether a timing signal is associated with or pertains to a pixel 208 being controlled by the control circuit 202. When it is determined that a timing signal is associated with a pixel 208 being controlled by the control circuit 202, the timing signal is output to a transfer circuit 804 and a flagging component 604.

As described with respect to FIGS. 6 and 7, the flagging component 604 is configured to set and clear a flag associated with a pixel 208 as a function of the timing signal. When the flagging component 604 identifies that the pixel 208 is in an integration period, the flagging component 604 is configured to output a signal that causes a first switch 806 to close and a second switch 808 to open. When the flagging component 604 identifies that the pixel 208 is in an idle period, the flagging component 604 is configured to output a signal that causes the first switch 806 to open and the second switch 808 to close. In some embodiments, at least one of the first switch 806 and the second switch 808 are transistors.

The first switch 806 is configured to receive a first signal via a first input terminal 810, and the second switch 808 is configured to receive a second signal via a second input terminal 812. Accordingly, when the first switch 806 is closed, the first signal flows into the transfer circuit 804, to indicate that the pixel 208 is in an integration period, for example. When the second switch 808 is closed, the second signal flows into the transfer circuit 804, to indicate that the pixel 208 is in an idle period, for example. The first signal is different than the second signal. For example, in some embodiments, the first signal is associated with a lower voltage than the second signal.

The transfer circuit 804 is configured to generate a transfer aspect of the control signal and to output the transfer aspect of the control signal to the transfer transistor 304 via an output node 814. Properties of the transfer aspect that are output by the transfer circuit 804 are a function of the timing signal, a transfer signal supplied via a fourth input node 816, the first signal received via the first input terminal 810 and the second signal receive via the second input terminal 812. For example, when the transfer circuit 804 receives the first signal, indicating that the pixel 208 is in an integration period, the transfer circuit 804 controls the turning on and off of the transfer transistor 304 as a function of the timing signal. When the timing signal indicates a desire to turn on the transfer transistor 304, the transfer component 804 apply a first voltage to the transfer transistor 304, for example, and when the timing signal indicates a desire to turn off the transfer transistor 304, the transfer component 804 applies a second voltage to the transfer transistor 304.

When the transfer circuit 804 receives the second signal, indicating that the pixel 208 is in an idle period, for example, the transfer circuit 804 is configured to apply a voltage to the transfer transistor 304 that causes the transfer transistor 304 to turn on, allowing electrical charge to flow through the transfer transistor 304 to other portions of the pixel 208, such as the floating diffusion node 316, for example. In some embodiments, the transfer circuit 804 applies the voltage of the second signal received via the second input terminal 812 to the transfer transistor 304. In some embodiments, the voltage of the second signal is applied to the transfer transistor 304 by the transfer circuit 804 until the flagging component 604 indicates a desire to enter integration period, such as indicated in the timing signal, for example.

Figure 9:
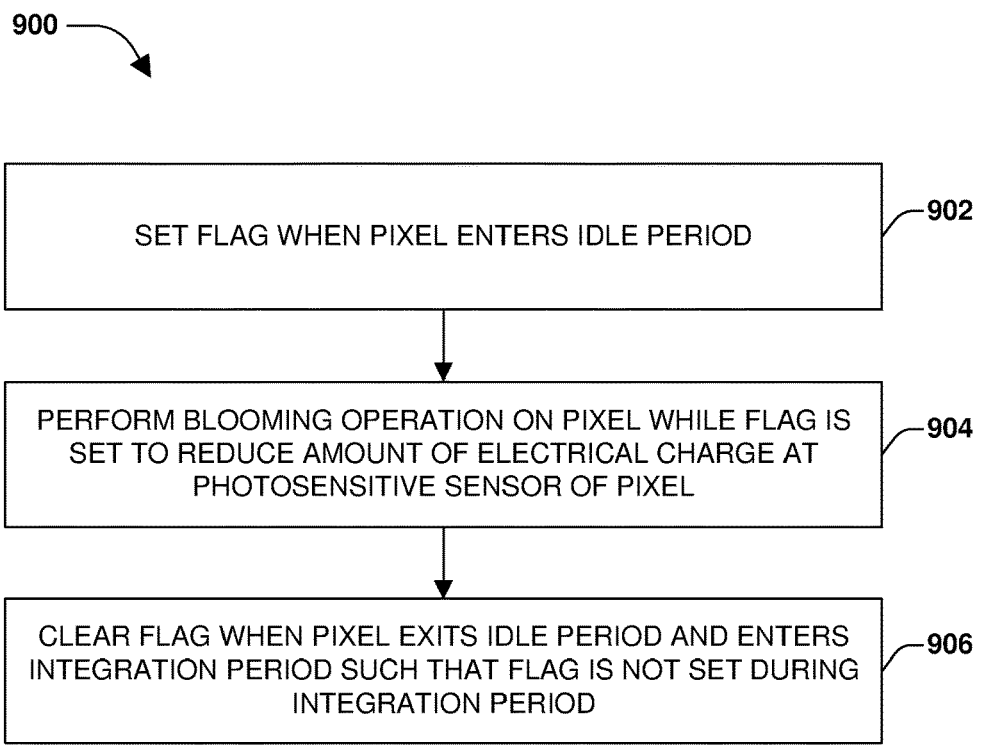
FIG. 9 is a flow chart diagram illustrating a method for reducing blooming during an idle period of a pixel according to some embodiments.

FIG. 9 is a flow diagram illustrating an example method 900 for reducing blooming during an idle period of a pixel. The method 900 comprises setting a flag when the pixel enters an idle period at 904. The flag is intended to indicate to a drive component or other components of the pixel array that the flag is in an idle period, and thus it is safe to perform a blooming operation on the pixel.

At 904 in the example method 900, a blooming operation is performed on the pixel while the flag is set to reduce an amount of electrical charge at a photosensitive sensor of the pixel. For example, in some embodiments, embodiment, the blooming operation comprises resetting the photosensitive sensor while the pixel remains in the idle period to dissipate at least some electrical charge at the photosensitive sensor. As an example, a transfer transistor and a reset transistor of the pixel are turned on at least once during an idle period to provide for discharging electrical charge that has accumulated at the photosensitive sensor and to provide for resetting a floating diffusion point of the pixel. In other embodiments, the blooming operation comprises maintaining the pixel in a reset state during at least a portion of the idle period to mitigate a build-up of electrical charge at the photosensitive sensor. That is, the pixel is maintained in a reset state for a prolonged period of time, relative to an idle reset, for example, to not only discharge electrical charge that has already accumulated at the pixel, but also to mitigate electrical charge from accumulating.

In another embodiment, the blooming operation comprises applying a voltage to a transfer transistor of the pixel that facilitates transferring electrical charge from the photosensitive sensor to a floating diffusion node of the pixel, to a voltage source coupled to the pixel, or to ground during the idle period to mitigate saturation of the electrical charge at the photosensitive sensor. For example, in some embodiments, a control signal having a first set of properties such as a first voltage is transmitted to the pixel, or to a transfer transistor of the pixel, during a first portion of the idle period to cause the photosensitive cell to accumulate charge. During a second portion of the idle period, one or more properties of the control signal are changed, such as a voltage, to cause electrical charge not to accumulate at the photosensitive sensor. As an example, the change in one or more properties causes the transfer transistor of the pixel to switch from being turned off to being turned on, allowing electrical charge to be transferred from the photosensitive sensor to other portions of the pixel, such as a floating diffusion node.

At 906 in the example method 900, the flag is cleared when the pixel exits that idle period and enters an integration period. During the integration period, as indicated when the flag is not set, a blooming operation is inhibited from occurring on the pixel. In this way, a blooming operation is not inadvertently performed when the pixel is measuring light and generating electrical charge to be used to generate an image.

According to an aspect of the instant disclosure, an image sensor is provided. The image sensor comprises a control circuit configured to drive a pixel of the image sensor, where the pixel is associated with an integration period and an idle period. The control circuit comprises a drive component configured to drive the pixel and a flagging component configured to identify when the pixel is in the integration period and when the pixel is in the idle period.

According to another aspect of the instant disclosure, a method for reducing blooming during an idle period of a pixel is provided. The method comprises setting a flag when the pixel enters an idle period and performing a blooming operation on the pixel while the flag is set to reduce an amount of electrical charge at a photosensitive sensor of the pixel. The method also comprises clearing the flag when the pixel exits the idle period and enters an integration period such that the flag is not set during the integration period.

According to yet another aspect of the instant disclosure, a light-capturing device is provided. The light-capturing device comprises an image sensor comprising a control circuit configured to drive a pixel, the control circuit comprising a flagging component configured to identify when the pixel is in an integration period. The light-capturing device also comprises a readout component configured to process a signal output by the pixel and indicative of electrical charge collected during at least a portion of the integration period.

Figure 10:
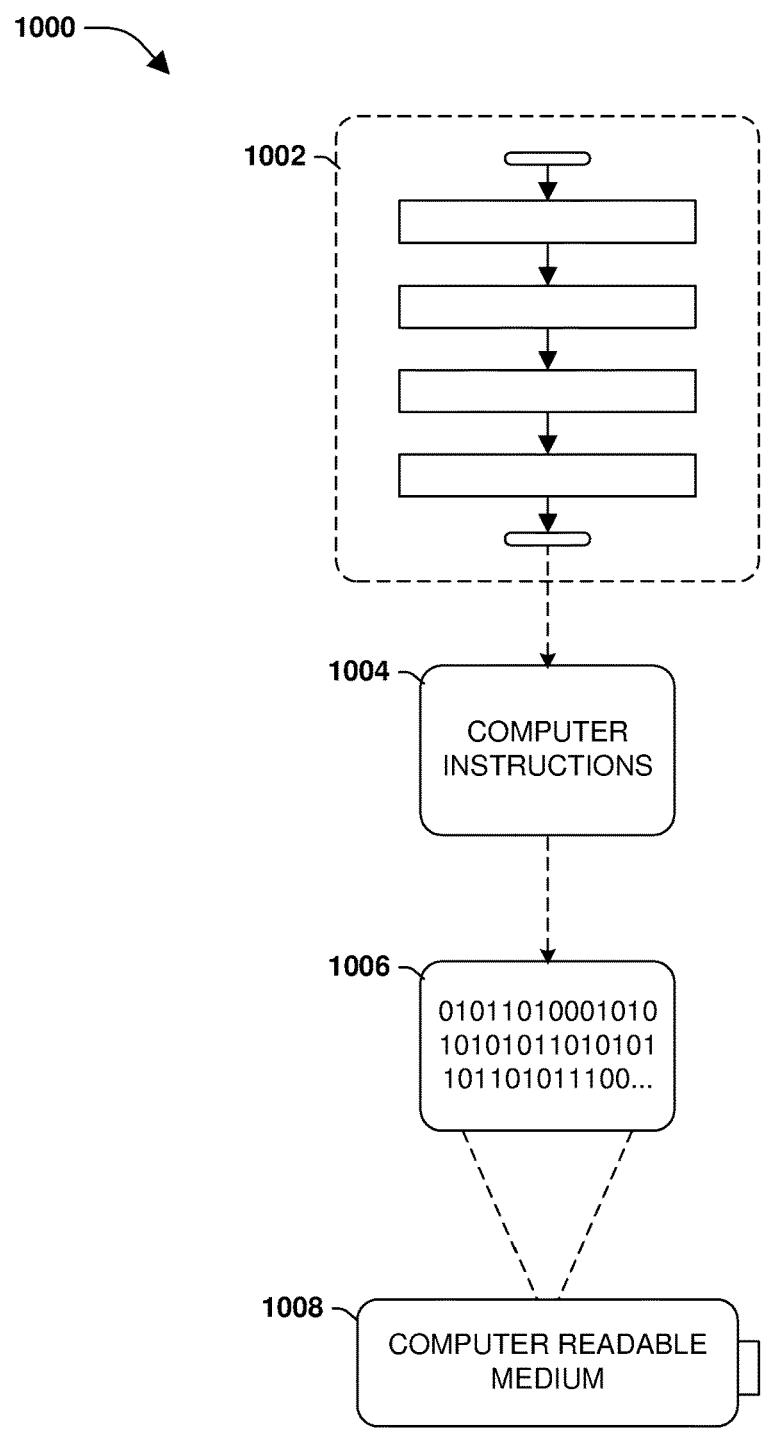
FIG. 10 is a diagram illustrating an example computer-readable medium, device, or memory comprising processor-executable instructions configured to embody one or more of the provisions set forth herein, according to some embodiments according to some embodiments.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 10, wherein an implementation 1000 comprises a computer-readable medium 1008, such as a CD-ft DVD-R, flash drive, a platter of a hard disk drive, etc., on which is encoded computer-readable data 1006. This computer-readable data 1006, such as binary data comprising a plurality of zero's and one's as shown in 1006, in turn comprises a set of computer instructions 1004 configured to operate according to one or more of the principles set forth herein. In an embodiment 1000, the processor-executable computer instructions 1004 are configured to perform a method 1002, such as at least some of the exemplary method 900 of FIG. 9. In an embodiment, the processor-executable computer instructions 1004 are configured to implement a system such as at least some of the control circuit 202 illustrated in FIG. 6. Many such computer-readable media are devised by those of ordinary skill in the art that are configured to operate in accordance with the techniques presented herein.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

It will be appreciated that layers, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, features, elements, etc. mentioned herein, such as implanting techniques, doping techniques, spin-on techniques, sputtering techniques such as magnetron or ion beam sputtering, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A method for reducing blooming during an idle period of a pixel, comprising:
   setting a flag to a first state when the pixel enters the idle period;
   performing a blooming operation on the pixel while the flag is set to the first state to reduce an amount of electrical charge at a photosensitive sensor of the pixel; and
   setting the flag to a second state when the pixel exits the idle period and enters an integration period.

2. The method of claim 1, wherein the flag is maintained in the second state during the integration period.

3. The method of claim 1, wherein setting the flag to a second state comprises clearing the flag.

4. The method of claim 1, comprising:
   inhibiting a blooming operation from occurring on the pixel when the flag is set to the second state.

5. The method of claim 1, the blooming operation comprising:
   transferring the electrical charge from the photosensitive sensor to a floating diffusion node of the pixel.

6. The method of claim 1, the blooming operation comprising:
   resetting the photosensitive sensor to dissipate at least some of the electrical charge at the photosensitive sensor.

7. The method of claim 6, the resetting comprising:
   coupling the photosensitive sensor to a voltage source to apply a voltage generated by the voltage source to the photosensitive sensor.

8. The method of claim 6, the resetting comprising:
   resetting the photosensitive sensor periodically during the idle period to dissipate at least some recurring electrical charge at the photosensitive sensor.

9. The method of claim 1, the blooming operation comprising:
maintaining the pixel in a reset state during at least a portion of the idle period to mitigate a buildup of electrical charge at the photosensitive sensor.

10. The method of claim 1, the performing comprising:
applying a control signal to the pixel, the control signal having a first set of properties during a first portion of the idle period and having a second set of properties during a second portion of the idle period.

11. The method of claim 1, wherein the integration period comprises a reset period, an exposure period, and a readout period.

12. The method of claim 11, wherein:
a reset operation is performed to reset a floating diffusion node of the pixel during the reset period;
electrical charge accumulates at the photosensitive sensor during the exposure period; and
the electrical charge is transferred to the floating diffusion node during the readout period.

13. The method of claim 1, the blooming operation comprising:
activating a transfer transistor of the pixel to transfer at least some of the electrical charge that has accumulated at the photosensitive sensor of the pixel to a floating diffusion node of the pixel, the transfer transistor coupled between the photosensitive sensor and the floating diffusion node; and
activating a reset transistor of the pixel to reset at least one of the floating diffusion node or the photosensitive sensor, the floating diffusion node coupled between the photosensitive sensor and the reset transistor.

14. A method for reducing blooming during an idle period of a pixel, comprising:
setting a flag to a first state when the pixel enters the idle period;
performing a blooming operation on the pixel while the flag is set to the first state, the blooming operation transferring electrical charge that has built up at a photosensitive sensor of the pixel during the idle period away from the photosensitive sensor; and
setting the flag to a second state when the pixel exits the idle period and enters an integration period.

* * * * *